United States Patent [19]

Litsenko et al.

[11] 4,146,407
[45] Mar. 27, 1979

[54] SOLAR PHOTOELECTRIC MODULE

[76] Inventors: Tatyana A. Litsenko, ulitsa Trubnaya, 11, kv. 12; Valery N. Potapov, ulitsa Timiryazevskaya, 13, kv. 213; Dmitry S. Strebkov, Luganskaya ulitsa, 21, all of Moscow, U.S.S.R.

[21] Appl. No.: 860,746
[22] Filed: Dec. 15, 1977
[51] Int. Cl.² .................................... H01L 31/04
[52] U.S. Cl. .................................... 136/89 PC
[58] Field of Search .................... 136/89 PC

[56] References Cited
U.S. PATENT DOCUMENTS

| | | | |
|---|---|---|---|
| 3,988,166 | 10/1976 | Beam | 136/89 |
| 4,045,246 | 8/1977 | Mlavsky et al. | 136/89 PC |
| 4,052,228 | 10/1977 | Russell | 136/89 PC |

Primary Examiner—John H. Mack
Assistant Examiner—Aaron Weisstuch
Attorney, Agent, or Firm—Lackenbach, Lilling & Siegel

[57] ABSTRACT

A solar photoelectric module is disclosed, wherein the solar energy concentrator also performs the function of a cooling means for the photovoltaic solar energy converter. With that object in view the concentrator is made as a hollow hermetically sealed vessel filled with a transparent heat transfer agent, while the photovoltaic solar energy converter is placed inside the hollow vessel.

7 Claims, 8 Drawing Figures

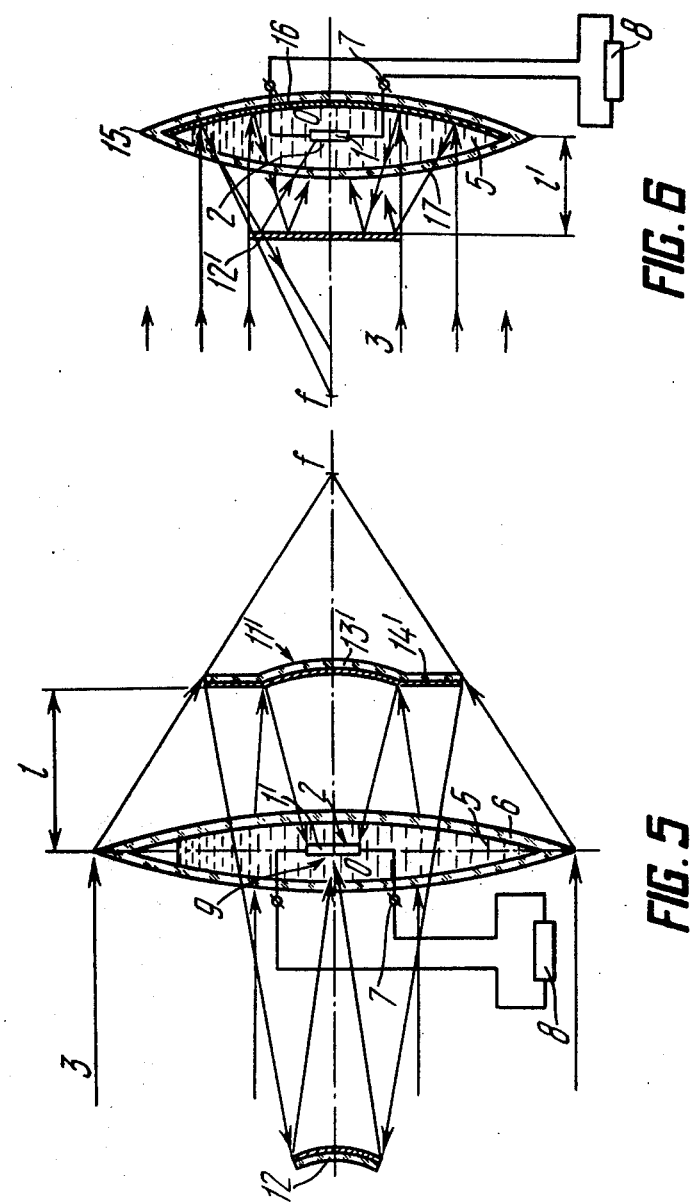

SOLAR PHOTOELECTRIC MODULE

The invention relates to devices for converting solar energy into electrical energy and has particular reference to solar photo-electric modules.

One prior-art solar photoelectric module is known (U.S. Pat. No. 3,383,246) to comprise a photovoltaic solar energy converter, a solar energy concentrator arranged across the pathway of solar radiation incident upon the effective (photosensitive) surface of the photovoltaic solar energy converter, and a means for cooling the latter. In the known solar photoelectric module the cooling means made as a swivel table coupled to the drive motor through the shaft. The photovoltaic solar energy converter is placed on the table top surface and, while rotating along therewith, is periodically withdrawn from the radiation zone so as to cool the photovoltaic solar energy converter; thus, the converter made use of in the known solar photoelectric module operates in a pulsed mode involving time intervals for cooling purposes. Furthermore, provision of a motor in the cooling system imposes additional power expenses and reduces the reliability of that system because the rotating components need periodic lubrication and replacement of worn out parts.

It is therefore an object of the present invention to add to provide a solar photoelectric module which is reliable.

It is another object of the present invention to provide a solar photoelectric module which has an increased efficiency over comparable prior art modules.

In order to achieve the above objects the essence of the invention resides in a solar photoelectric module which comprises a photovoltaic solar energy converter, a solar energy concentrator located across the pathway of solar radiation striking upon at least one effective surface of the photovoltaic solar energy converter, and a means for cooling said photovoltaic solar energy converter, and according to the invention the concentrator used as a cooling means is made as a hollow hermetically sealed vessel filled with a transparent heat transfer agent into which the photovoltaic solar energy converter is placed.

The hollow vessel is advantageously made as a convergent transparent lens provided with a specular reflector situated opposite the effective surface of the photovoltaic solar energy converter.

In such a case the specular reflector may be made flat and spaced apart from the effective surface of the photovoltaic solar energy converter at a distance about equal to half the focal length of the lens.

It is likewise practicable to locate the photovoltaic solar energy converter in the bottom portion (with respect to the Sun) of the lens, and arrange the specular reflector at an angle to the optical axis of the lens so as to reflect solar radiation onto the effective surface of the photovoltaic solar energy converter.

When employing a photovoltaic solar energy converter having two effective surfaces, it is preferable to provide an additional convergent lens opposite the other effective surface of the photovoltaic solar energy converter at a distance therefrom approximately equal to the focal length of the additional lens, the area of the latter being about half the area of the principal lens.

When using a photovoltaic solar energy converter with two effective surfaces use can also be made of an additional specular reflector for solar radiation, situated opposite the second effective surface of the photovoltaic solar energy converter at a distance therefrom sufficient to enable the additional reflector to reflect solar radiation onto the second effective surface of the photovoltaic solar energy converter, whereas the principal specular reflector can be composed in this case of two members, viz., a central portion adapted for reflecting solar radiation onto the first effective surface of the photovoltaic solar energy converter, and a peripheral portion adapted for reflecting solar radiation onto the additional reflector.

It is also advantageous that one wall of the hollow vessel be made as a specular focusing reflector and the opposite wall thereof be made transparent, whereas the photovoltaic solar energy converter is advantageously arranged such that its effective surface faces the transparent wall of the vessel, and that an additional reflector be located opposite said vessel transparent wall, adapted for focusing solar radiation onto the effective surface of the photovoltaic solar energy converter.

It is also advisable that one of the walls of the hollow vessel be made as a specular reflector having its focal length lying within said vessel, that the opposite wall of the vessel be made transparent and the photovoltaic solar energy converter be situated at the focal point of the reflector.

It is desirable that the solar photoelectric module of the invention comprise an additional photovoltaic solar energy converter facing with its effective surface towards that of the principal photovoltaic solar energy converter and located, similar to the latter, in a hollow hermetically sealed vessel. Both of said vessels are in fact transparent convergent lenses of which the lens of the principal photovoltaic solar energy converter serves as a solar energy concentrator for the additional photovoltaic solar energy converter, and the lens of the additional photovoltaic solar energy converter serves as a solar energy concentrator for the principal photovoltaic solar energy converter. Provision is made for a specular reflector arranged opposite each of said lenses at an angle to the optical axis thereof, said reflector being adapted for directing solar radiation simultaneously onto the effective surfaces of both photovoltaic solar energy converters.

The solar photoelectric module made in accordance with the present invention provides for effective cooling and reliable protection of the photovoltaic solar energy converter against deleterious effects caused by environmental conditions, as well as high radiant energy concentration.

Moreover, the herein-proposed solar photoelectric module is distinguished by its high efficiency because it makes continuous use of the photovoltaic solar energy converter, while its cooling is effected by the heat transfer agent contained in the hermetically sealed vessel and, consequently, no additional power is needed for cooling purposes. Such a module possesses high reliability inasmuch as it incorporates no revolving friction causing components, requires no special maintenance and is constructionally simple.

In what follows, the present invention is disclosed in some specific embodiments thereof given by way of illustration with reference to the accompanying drawings, wherein:

FIG. 5 is a longitudinal-sectional view of a solar photoelectric module having the specular reflector composed of two members, viz., a central curved portion and a peripheral flat portion, according to the invention;

FIG. 6 is a longitudinal-sectional view of a solar photoelectric module having the specular reflector combined with the wall of the hollow vessel and the additional reflector, according to the invention;

Figure 1:
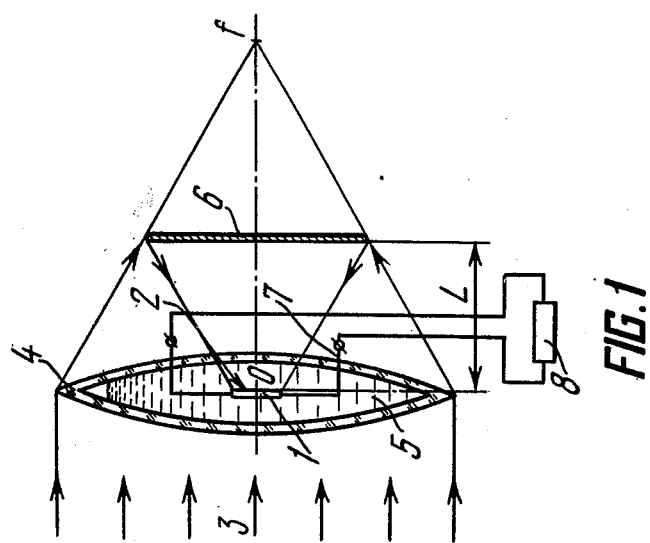
FIG. 1 is a longitudinal-sectional view of a solar photoelectric module having the solar energy concentrator made as a convergent lens, according to the invention.

Reference being directed to the accompanying drawings, FIG. 1 illustrates a constructional arrangement of the solar photoelectric module embodying the present invention, which includes a photovoltaic solar energy converter 1 having an effective (photosensitive) surface 2 adapted to receive solar radiation 3, said converter 1 being placed in a hollow hermetically sealed vessel 4 filled with a transparent heat transfer agent 5. The vessel 4 serves at the same time as the solar energy concentrator and a cooling means for the photovoltaic solar energy converter 1. In the exemplary embodiment under consideration the vessel 4 is in fact a convergent transparent lens, hereinafter referred to as the lens 4, provided with a specular reflector 6. The reflector 6 may be a flat, convex or concave mirror made of, say, glass coated with a sprayed-on layer of aluminum or silver.

In the embodiment of the present invention shown in FIG. 1 the specular reflector 6 is made flat and is spaced apart from the effective surface 2 of the photovoltaic solar energy converter 1 at a distance L about equal to half the focal length "f" of the lens 4.

The converter 1 is provided with current leadouts 7 brought outside the lens 4 without deteriorating the hermetic sealing thereof, and which are adapted for connecting the photovoltaic solar energy converter 1 to a load 8 for the generated electric power. Indicated in the drawing by arrowheads is the pathway of light rays striking upon the effective surface 2 of the photovoltaic solar energy converter 1.

Figure 2:
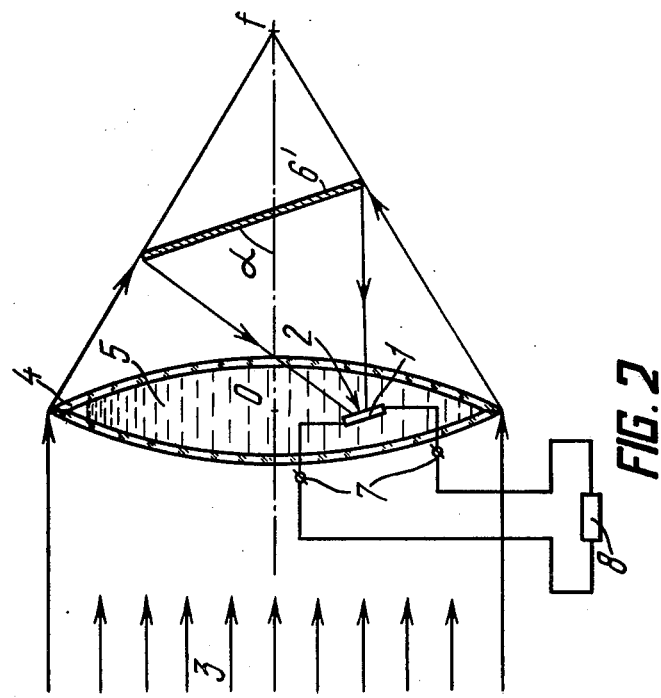
FIG. 2 is a longitudinal-sectional view of a solar photoelectric module having the photovoltaic solar energy converter disposed in the lens bottom portion, according to the invention.

In an exemplary embodiment of the solar photoelectric module as illustrated in FIG. 2, as distinguished from the preceding embodiment, the photovoltaic solar energy converter 1 is located in the bottom portion (with respect to the Sun) of the lens 4, while the specular reflector 6' makes an angle α with the optical axis of the lens 4.

Figure 3:
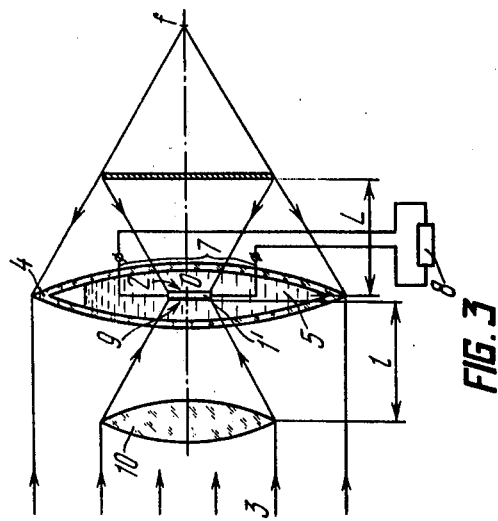
FIG. 3 is a longitudinal-sectional view of a solar photoelectric module having an additional lens, according to the invention.

One more embodiment of the solar photoelectric module is represented in FIG. 3, wherein the photovoltaic solar energy converter 1' has two effective surfaces 2 and 9, respectively, while an additional convergent lens 10 is arranged opposite the latter effective surface 9 of the photovoltaic solar energy converter 1', the area of said additional convergent lens being approximately equal to half the area of the principal lens 4.

The additional lens 10 is spaced a distance 1 away from the effective surface 9 of the photovoltaic solar energy converter 1', the distance 1 being approximately equal to the focal length of the lens 10.

Figure 4:
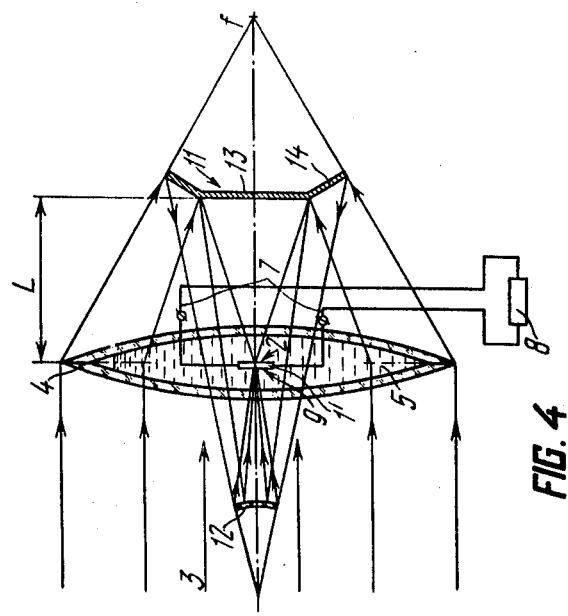
FIG. 4 is a longitudinal-sectional view of a solar photoelectric module having the specular reflector composed of two members, viz., a central flat portion and a peripheral curved portion, according to the invention.

In still another embodiment of the solar photoelectric module illustrated in FIG. 4, unlike that shown in FIG. 3, bilateral irradiation of the photovoltaic solar energy converter 1' accomplished by the provision of two reflectors 11 and 12, a principal one and an additional one, respectively. The reflector 12 is curved and is situated opposite to the effective surface 9 at a distance therefrom sufficient for solar radiation 3 to be directed onto said effective surface 9. The reflector 11 which is disposed opposite the effective surface 2 incorporates two components, viz., a central flat portion 13 adapted for reflecting solar radiation 3 onto the surface 2 of the photovoltaic solar energy converter 1', and a peripheral slanted portion 14 adapted for reflecting solar radiation 3 onto the additional reflector 12.

FIG. 5 presents yet another embodiment of the solar photoelectric module similar to the preceding one and differing therefrom only in the constructional arrangement of the principal reflector 11' whose central portion 13' is made curved and the peripheral portion 14' is flat.

In the embodiment of the solar photoelectric module shown in FIG. 6, one wall of hollow vessel 15 is made as a specular reflector 16 adapted for focusing solar radiation 3, while its opposite wall 17 is made transparent. The photovoltaic solar energy converter 1 with its effective surface 2 faces the transparent wall 17, opposite of which the additional reflector 12' is located, adapted for directing solar radiation 3 focused by the reflector 16 onto the effective surface 2 of the photovoltaic solar energy converter 1. The additional reflector 12' is spaced apart from the effective surface 2 of the photovoltaic solar energy converter 1 by a distance 1' approximately equal to half the focal length f' of the specular reflector 16.

Figure 7:
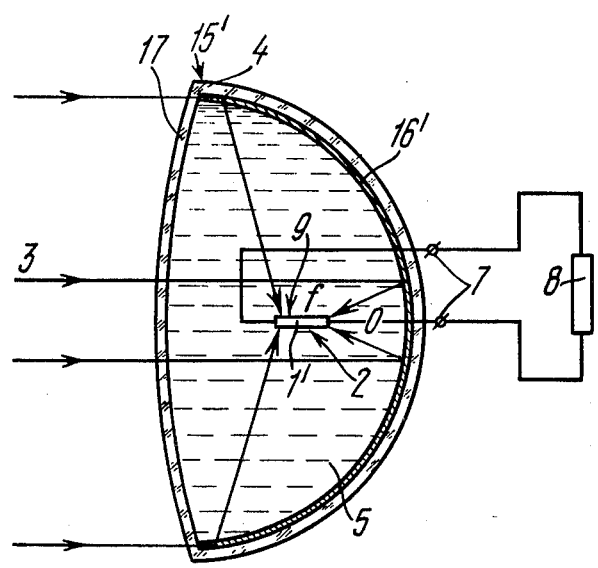
FIG. 7 is a longitudinal-sectional view of a solar photoelectric module having the specular reflector combined with the wall of the hollow vessel wherein the focal length thereof lies within the vessel, according to the invention.

FIG. 7 presents a further embodiment of the proposed solar photoelectric module, wherein one wall of the hollow vessel 15' is made as the specular reflector 16' having its focal length 'f' lying within the vessel 15', while the opposite wall 17 is transparent to solar radiation 3 incident upon the reflector 16'. In this case, the photovoltaic solar energy converter 1' is situated at the focal point of the reflector 16', and solar radiation 3 falls upon both the effective surfaces 2 and 9 thereof.

If use is made of a reflector having a longer radius of curvature, is is expedient to employ a photovoltaic solar energy converter having but one effective surface which must face the reflector (not shown).

Figure 8:
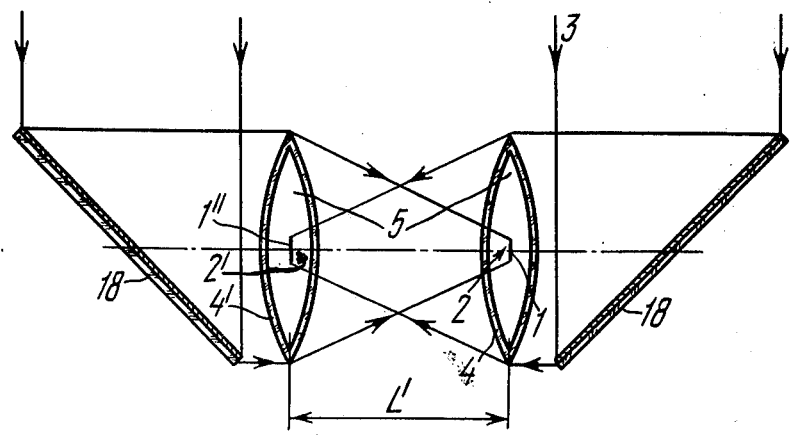
FIG. 8 is a longitudinal-sectional view of a solar photoelectric module having two photovoltaic solar energy converters, according to the invention.

FIG. 8 shows an embodiment of a solar photoelectric module which differs from the preceding ones in having two hollow hermetically sealed vessels which are essentially similarly formed transparent convergent lenses 4 and 4' filled with the heat transfer agent 5. The lenses 4 and 4' are spaced apart at a distance L' approximately equal to the focal length thereof. Situated at the center of the lens 4 is photovoltaic solar energy converter 1, while an additional photovoltaic solar energy converter 1" is located at the center of lens 4', both of the photovoltaic solar energy converters 1 and 1" facing each other with their respective effective surfaces 2 and 2'. The lens 4 serves as the solar energy concentrator for the photovoltaic solar energy converter 1" located in the lens 4' and conversely, the lens 4' serves as the solar energy concentrator for the photovoltaic solar energy converter 1 located in the lens 4. A specular reflector 18 is provided opposite each of the lenses 4 and 4' at an angle (which equals 45° in the given particular embodiment) to the optical axis of both lenses, 4, 4', the reflectors being adapted for directing solar radiation 3 simultaneously onto the effective surfaces 2 and 2' of the respective photovoltaic solar energy converters 1 and 1".

The solar photoelectric modules proposed in the present invention operate as follows.

Solar radiation 3 (FIG. 1) passes through the lens 4, is focused by the specular reflector 6 and reflected onto the effective surface 2 of the photovoltaic solar energy converter 1.

Electric power generated by the photovoltaic solar energy converter 1 is fed through the current leadouts to the load 8. Heat energy evolved during electric power generation is withdrawn from the photovoltaic solar energy converter 1 to the walls of the lens 4 by means of the heat transfer agent 5 by virtue of convective heat conduction.

With the photovoltaic solar energy converter 1 (FIG. 2) located in the bottom portion of the lens 4 conditions for heat withdrawal from the photovoltaic solar energy converter 1 to the walls of the lens 4 are substantially improved due to formation of ascending thermal currents.

Improved thermal conditions of the solar photoelectric module of the invention also occur when using the photovoltaic solar energy converter 1' (FIG. 3) having two effective surfaces 2 and 9.

In such a case solar radiation is divided into two nearly equal portions so that the photovoltaic solar energy converter 1' is irradiated on both sides. This is obtained due to the provision of the additional convergent lens 10 placed across the pathway of the solar radiation 3. Part of the solar radiation 3 is focused by the lens 10 onto the effective surface 9 of the photovoltaic solar energy converter 1', whereas the effective surface 2 is irradiated by the other portion of the solar radiation 3 which passes through that portion of the lens 4 which is not shaded by the lens 10 and is focused by the specular reflector 6.

A similar effect is attained with the embodiments of the solar photoelectric modules illustrated in FIGS. 4 and 5, each incorporating two specular reflectors 11, 12 and 11', 12', respectively. In these solar photoelectric modules solar radiation 3 passes through the lens 4 onto the reflector 11 (11') and upon having been reflected by the central portion 13 (13') thereof, is incident upon the effective surface 2 of the photovoltaic solar energy converter 1'. Part of the solar radiation (approximately half its total amount) is reflected by the peripheral portion 14 (14') of the reflector 11 (11') onto the additional reflector 12 and is transferred by it to the effective surface 9 of the photovoltaic solar energy converter 1'.

The arrangement shown in FIG. 5 may be made more space-saving as compared to that illustrated in FIG. 4 due to a shorter distance L.

The solar photoelectric module having the specular reflector 16 (FIG. 6) combined with the wall of the hollow vessel 15 operates as follows:

Solar radiation 3 passes through the transparent wall 17, is focused by the specular reflector 16 onto the additional reflector 12'; upon being reflected by the latter, the solar radiation 3 is directed onto the effective surface 2 of the photovoltaic solar energy converter 1.

The arrangement of the solar photoelectric module of FIG. 6 is well suited for conjoint operation with the elements of a Sun tracking system inasmuch as the vessel 15 has an opaque wall.

When the focal length 'f' (FIG. 7) of the reflector 16' lies within the hollow vessel 15, solar radiation 3 is focused by the reflector 16' onto the effective surfaces 2 and 9 of the photovoltaic solar energy converter 1'.

The embodiment of the solar photoelectric module shown in FIG. 7, apart from being more convenient in arranging, provides a higher utilization factor of solar radiation 3, as the latter fully impinges upon the reflector 16', this being due to absence of the additional reflector which shades part of the solar radiation.

The solar photoelectric module comprising two photovoltaic solar energy converters 1 and 1" (FIG. 8), operates as follows. Solar radiation 3 is reflected by the specular reflectors 18 and focused by the lenses 4 and 4'.

Then, solar radiation 3 focused by the lens 4 impinges on the effective surface 2' of the photovoltaic solar energy converter 1" accommodated inside lens 4', while solar radiation 3 focused by the lens 4' is incident upon the effective surface 2 of the photovoltaic solar energy converter 1 accommodated inside lens 4.

The embodiment of the solar photoelectric module shown in FIG. 8 is especially convenient for tracking the Sun as this is attained by merely swivelling the reflectors 18 in keeping with the movement of the Sun.

What is claimed is:

1. A solar photoelectric module, comprising: a solar energy concentrator, said concentrator being made as a hermetically sealed hollow vessel having at least one transparent wall and formed in the shape of a convergent lens; a transparent heat transfer agent filling said vessel; a photovoltaic solar energy converter accommodated inside said vessel in said heat transfer agent and having at least one effective surface; said photovoltaic solar energy converter being so oriented that solar radiation concentrated by said concentrator impinges upon said effective surface of said photovoltaic solar energy converter; current leadouts from said photovoltaic solar energy converter extending to the exterior of said vessel without impairing the hermetic sealing thereof; and a reflector located outside of said vessel opposite said effective surface of said photovoltaic solar energy converter.

2. A solar photoelectric module as claimed in claim 1, wherein said reflector located outside of said vessel opposite said effective surface of the photovoltaic solar energy converter is a specular reflector.

3. A solar photoelectric module as claimed in claim 2, wherein said specular reflector is made flat and is spaced apart from said effective surface of the photovoltaic solar energy converter at a distance nearly equal to half the focal length of said lens.

4. A solar photoelectric module as claimed in claim 3, wherein said photovoltaic solar energy converter is provided with two effective surfaces, further comprising an additional convergent lens arranged opposite said other effective surface of the photovoltaic solar energy converter at a distance approximately equal to the focal length of said lens, the area of said additional lens being about half the area of said principal lens.

5. A solar photoelectric module as claimed in claim 2, wherein said photovoltaic solar energy converter is located in the bottom portion of said lens; and said specular reflector makes angle with the optical axis of said lens so as to reflect solar radiation onto said effective surface of the photovoltaic solar energy converter.

6. A solar photoelectric module as claimed in claim 2, wherein said photovoltaic solar energy converter is provided with two effective surfaces and an additional specular-type solar radiation reflector which is situated opposite said other effective surface of the photovoltaic solar energy converter at a distance sufficient to provide reflection of solar radiation by said additional reflector onto said other effective surface of the photovoltaic solar energy converter; said principal specular reflector being made of two components, a central portion adapted for reflecting solar radiation onto said first effective surface of the photovoltaic solar energy converter, and a peripheral portion adapted for reflecting solar radiation onto said additional reflector.

7. A solar photoelectric module, comprising: a first hollow, hermetically sealed, transparent convergent lens; a second transparent convergent lens similar to the aforesaid one and spaced apart therefrom at a distance nearly equal to the focal length of the abovementioned lenses, each of said lenses being filled with a heat transfer agent; first and second photovoltaic solar energy converters, each having effective surface; one of said photovoltaic solar energy converters being situated at the center of each of said lenses with said effective surfaces facing each other; said first lens serving as the solar energy concentrator for said photovoltaic solar energy converter situated in said second lens; said second lens serving as the solar energy concentrator for said photovoltaic solar energy converter located in said first lens; first and second specular reflectors, each situated opposite each of said lenses at an angle to the optical axis of a given lens so as to direct solar radiation simultaneously onto said effective surfaces of both of said photovoltaic solar energy converters; current leadouts from said photovoltaic solar energy converters extending outside of said lenses without impairing the hermetic sealing thereof.

* * * * *